United States Patent
Kageyama et al.

(10) Patent No.: US 7,089,267 B2
(45) Date of Patent: Aug. 8, 2006

(54) METHOD AND APPARATUS FOR FILE MANAGEMENT

(75) Inventors: Masahiro Kageyama, Hino (JP); Hisao Tanabe, Hachioji (JP); Tomokazu Murakami, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 566 days.

(21) Appl. No.: 09/942,782

(22) Filed: Aug. 31, 2001

(65) Prior Publication Data

US 2002/0152349 A1 Oct. 17, 2002

(30) Foreign Application Priority Data

Apr. 12, 2001 (JP) ............................. 2001-113407

(51) Int. Cl.
*G06F 12/00* (2006.01)
(52) U.S. Cl. ...................... 707/200; 707/203; 707/202; 714/710; 714/763
(58) Field of Classification Search ................ 707/210, 707/200–205; 714/910, 807, 768, 805, 710
See application file for complete search history.

(56) References Cited

U.S. PATENT DOCUMENTS

| | | | | |
|---|---|---|---|---|
| 4,525,839 A | * | 6/1985 | Nozawa et al. | 714/710 |
| 5,130,969 A | | 7/1992 | Sako | |
| 5,878,020 A | * | 3/1999 | Takahashi | 369/59.25 |
| 6,014,755 A | * | 1/2000 | Wells et al. | 714/710 |
| 6,049,515 A | * | 4/2000 | Yamamuro | 369/47.14 |
| 6,182,240 B1 | * | 1/2001 | Mine | 714/5 |
| 6,338,153 B1 | * | 1/2002 | Sasaki et al. | 714/710 |
| 6,363,211 B1 | | 3/2002 | Kanota et al. | |
| 6,501,905 B1 | * | 12/2002 | Kimura | 386/126 |
| 6,530,037 B1 | * | 3/2003 | Ando et al. | 711/112 |
| 6,662,309 B1 | * | 12/2003 | Ando et al. | 714/8 |
| 6,665,690 B1 | * | 12/2003 | Kimura et al. | 707/205 |
| 6,671,243 B1 | * | 12/2003 | Ando et al. | 369/59.1 |
| 6,697,958 B1 | * | 2/2004 | Yada et al. | 714/6 |
| 6,732,303 B1 | * | 5/2004 | Sasaki et al. | 714/710 |
| 2001/0054168 A1 | * | 12/2001 | Chung et al. | 714/763 |
| 2002/0099722 A1 | * | 7/2002 | Kimura et al. | 707/200 |
| 2004/0022171 A1 | * | 2/2004 | Ko | 369/275.3 |

FOREIGN PATENT DOCUMENTS

JP 7-111035 4/1995

* cited by examiner

*Primary Examiner*—Jean M. Corrielus
*Assistant Examiner*—Anh Ly
(74) *Attorney, Agent, or Firm*—Mattingly, Stanger, Malur & Brundidge, P.C.

(57) ABSTRACT

File management method having first and second processing modes for storing file type information for discrimination between first and second processing modes in recording medium as file management information associated with file for file management. In first processing mode, when data in the form of file is written on a recording medium and a write error occurs, replacement processing to another write area is performed to write the data in another area. In second processing mode, when write error occurs, the replacement processing to other write area is not performed to write the data. Method includes reading file type information associated with a file to be processed from recording medium, converting the file type from file type indicative of first processing mode to file type indicative of second processing mode, and writing the file type after conversion in recording medium as file management information associated with the file to be processed.

25 Claims, 13 Drawing Sheets

FIG.2
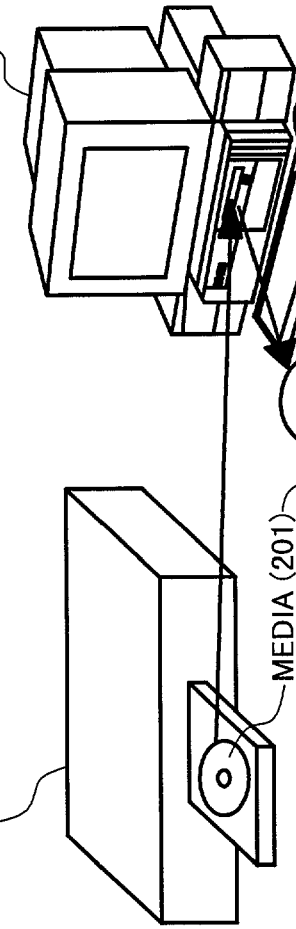
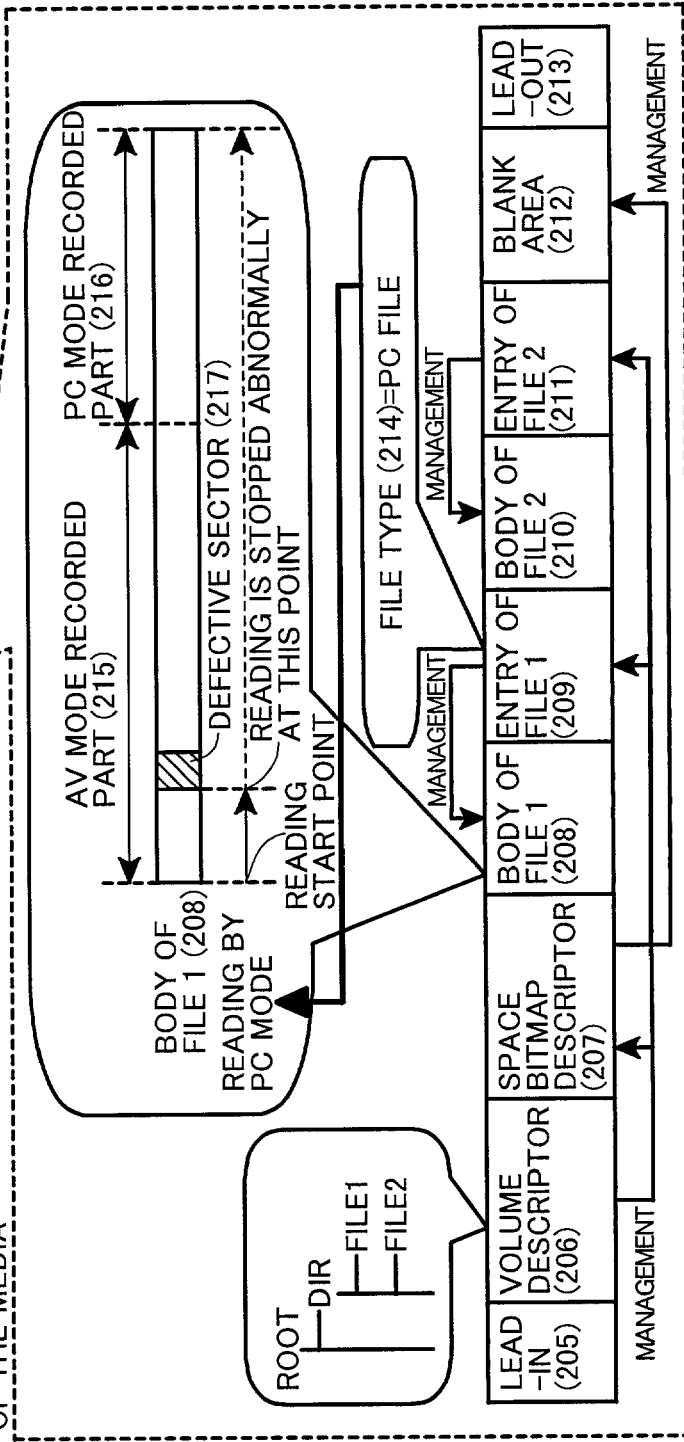

FIG.5
|  |  | PC FILE | AV FILE |
|---|---|---|---|
| FILE ENTRY (209) | FILE THPE (214) | 5 | 249 |
|  | NON-RELOCATABLE FLAG (501) | 0 (RELOCATABLE) | 1 (NON-RELOCATABLE) |
| FILE BODY (208) | ECC BLOCK STATE (502) | OTHER FILES CAN SHARE THIS ECC BLOCK | OTHER FILES MUST NOT SHARE THIS ECC BLOCK |
| FILE TAIL (503) | ECC BLOCK STUFFING (504) | NOT NEEDED | MANDATED |
FIG.6A
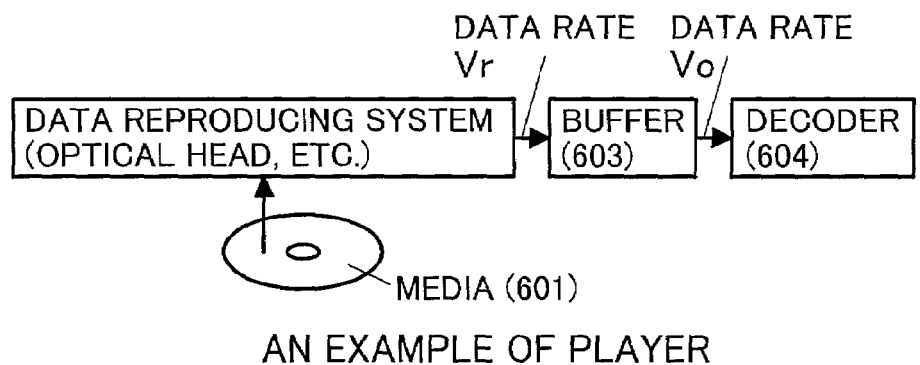
AN EXAMPLE OF PLAYER
FIG.6B
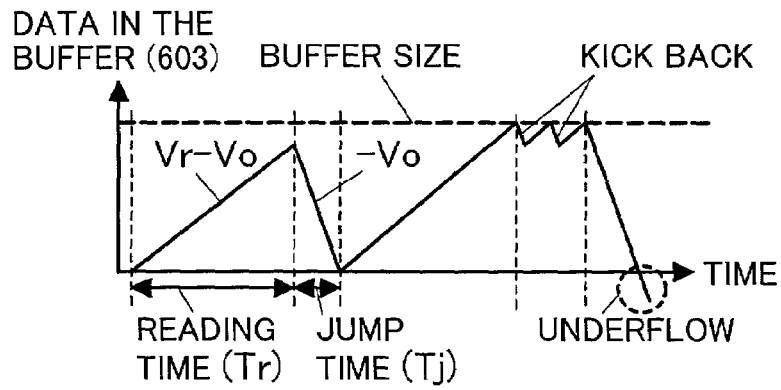
AN EXAMPLE OF BUFFER BEHAVIOR

METHOD AND APPARATUS FOR FILE MANAGEMENT

BACKGROUND OF THE INVENTION

The present invention relates to file management methods and more particularly, to a file management method which can be effectively used when there are mixedly present, in a single file on a recording medium, data recorded in an operational mode wherein data reliability is essential and data recorded in an operational mode wherein data transmission rate is essential.

A system utilizing a re-writable data recording medium is estimated to have an application as a data storage device of a personal computer (PC) or the like and an application as an audio/video (AV) recorder such as a video recorder or an audio recorder. In the PC application, in general, it is important to secure data reliability; whereas, in the AV application, it is important to secure operation (seamless operation) of recording and reproducing a video or audio signal continuously with respect to time.

In the PC application, in order to secure the data reliability, the data is read immediately after the data is written to determine the presence or absence of a data error. In the presence of a data error, write verify operation is usually carried out for its rewriting. Further, when many times of rewriting operation results in occurrence of the data error, the system determines that its recording area (which will be referred to as the sector, hereinafter) is defective and usually performs replacement processing to replace the sector with another area by its preliminary new recording area (which will be referred to as the replacement sector, hereinafter) previously prepared on the same recording medium. In this case, the system usually combines a plurality of (e.g., 16) sectors each as a minimum recording unit into an error correction code (ECC) block, and performs the replacement processing on a block basis. Similarly, even when reading data, the system performs error judgement. And at the time of error occurrence, the system performs its rereading operation or reads data from its replacement sector. When an uncorrectable data error takes place, it is common practice that the system gives a priority to securing the data reliability and performs its abnormal end operation to stop its writing or reading. Through such operations, the system can minimize the data error which may be inadvertently included and can secure data reliability. However, a data transmission rate (i.e., writing or reading rate) to a recording medium becomes lower. Such write/read operational mode will be referred to as the PC mode, hereinafter.

In the AV application, for the purpose of securing the seamless operation, it is common practice that, even when an error takes place in a data write or read mode, the system ignores the error and continues the writing or reading operation as it is. In this case, the data transmission rate to the recording medium can be kept high but the data reliability is lowered. Such a write/read operational mode will be referred to as the AV mode, hereinafter.

A unit for driving a recording medium generally has previously PC and AV mode recording/reproducing mechanisms, either one of which can be selected by parameter setting of an external control command and then be operated. For example, in the case of a digital versatile disc random access memory (DVD-RAM), the drive unit usually operates in the PC mode. However, when the parameter of a streaming flag bit is set from 0 to 1 and a write or read command is sent to the drive unit, the drive unit can operate in the AV mode.

It is also common to record information indicative of one of which modes wherein the data is recorded on the recording medium together with the data. In the case of the above DVD-RAM, a file system using the subset of the International Standard ISO/IEC1346 is formed on the recording medium, respective data are file-structured for their management, and file type information for identification between a file (which will be referred to as the PC file, hereinafter) recorded in the PC mode and a file (which will be referred to as the AV file, hereinafter) recorded in the AV mode is recorded in management information called a file entry. In this case, a file and the type of the file have a 1:1 relation and thus it is impossible to set a plurality of file types for a single file.

A sector (which will be referred to as the defective sector, hereinafter) containing such a defect as mentioned above includes not only a sector containing a physical defect on a recording medium but also a sector from which data cannot be normally read or written due to a deposition of dust or fingerprint thereon.

SUMMARY OF THE INVENTION

The above DVD-RAM example has a history that a drive unit and file system driver software (which will be referred to as the file system driver, hereinafter) designed only for the PC mode were first commercialized and thereafter a drive unit and file system driver designed to cope with both of the AV and PC modes were commercialized. Accordingly, there exist a drive unit and file system driver which cannot recognize that a file on the recording medium was recorded in the AV file (in other words, which handle all files as recorded in the PC mode, and also a drive unit and file system driver which can read a file recorded in the AV mode but cannot write it.

As shown in FIG. 2, for example, it is assumed that a video recorder 202 wrote video data on a DVD-RAM recording medium 201 in an AV mode and also recorded on the recording medium file type information indicating that the file is an AV file. It is also assumed that the recording medium 201 was mounted in a drive unit of a personal computer (PC) 203, the above video data was edited on a video editing application software or the like and again written on the same recording medium 201. At this time, if the drive unit and file system driver of the PC are designed to allow writing only in the PC mode, then the file written on the recording medium is set as a PC file having file type information 214.

The file system (subset of the ISO/IEC13346 Standards) of the aforementioned DVD-RAM can set only one file type information for each file. For this reason, in the example of FIG. 2, file data 208 (referred to as the file body, hereinafter), which is a mixture of an AV mode recorded part 215 and a PC mode recorded part 216, is created, and the file type information 214 of this file is a PC file.

As mentioned above, even when an error occurs on its way to reading data in the AV mode, the system ignores the error and continues the writing operation. Thus the AV mode recorded part 215 may include a defective sector 217 or the like. Meanwhile, at the time of reading the file, the file system driver refers to the file type information 214 and reads the data from the drive unit with use of a command parameter for the PC mode. However, when the driver reads an error portion of the defective sector 217 in the PC mode, it performs the reading operation many times, eventually judges that the data is destroyed, and ends abnormally in the middle of the reading operation. In other words, when the file is read sequentially from its head, data written in a portion followed by the defective sector 217 cannot be read.

It is therefore an object of the present invention to provide a file management method which, even when data recording is carried out with use of a drive unit and file system driver not designed for AV mode writing, can smoothly read data to the end of a file without causing abnormal end on the way to read the data.

In accordance with an aspect of the present invention, there is provided a file management method which has first and second processing modes and which stores information (which will be referred to as the file type, hereinafter) for discrimination between first and second processing modes in a recording medium as file management information associated with a file to be processed for file management. In the first processing mode, when data in the form of a file is written on a recording medium and a write error occurs, replacement processing to another write area is carried out to write the data in the other area. In the second processing mode, when the write error occurs, the replacement processing to the other write area is not carried out to write the data. The method includes the steps of reading a file type associated with the file to be processed from the recording medium, converting the file type from the file type indicative of the first processing mode to a file type indicative of the second processing mode, and writing the file type after the conversion in the recording medium as file management information associated with the file to be processed.

The replacement processing is carried out on an ECC block basis, the block as a recording unit including N (N: positive integer) sectors. The method further includes steps of judging whether or not the data belonging to the file to be processed is stored in all the N sectors of the ECC block, and when judging that the data is not stored in the ECC block, registering one (referred to as the remaining sector) of the sectors in the ECC block having the data of the file to be processed stored therein where the data is not stored as a stuffing in the file management information.

In accordance with another aspect of the present invention, there is provided a file management method which has a first processing mode wherein, when data in the form of a file is written on a recording medium and a write error occurs, replacement processing to another write area is carried out to write the data in the other area, and also has a second processing mode wherein, when the write error occurs, the replacement processing to the other write area is not carried out to write the data. In this case, the replacement processing is carried out on a basis of an ECC block including N (N: positive integer) recording units or sectors. The method includes the steps of reading data stored at a recording location after the replacement processing, and writing the data in the recording location prior to the replacement processing.

BRIEF DESCRIPTION OF THE DRAWINGS

FIG. 2 is a diagram for explaining how to write data to a recording medium;

FIG. 5 is a table for comparison between features of PV and AV files;

FIG. 6A is a structure of a general player;

FIG. 6B is a diagram for explaining the operation of the player;

DESCRIPTION OF THE EMBODIMENTS

Figure 1:
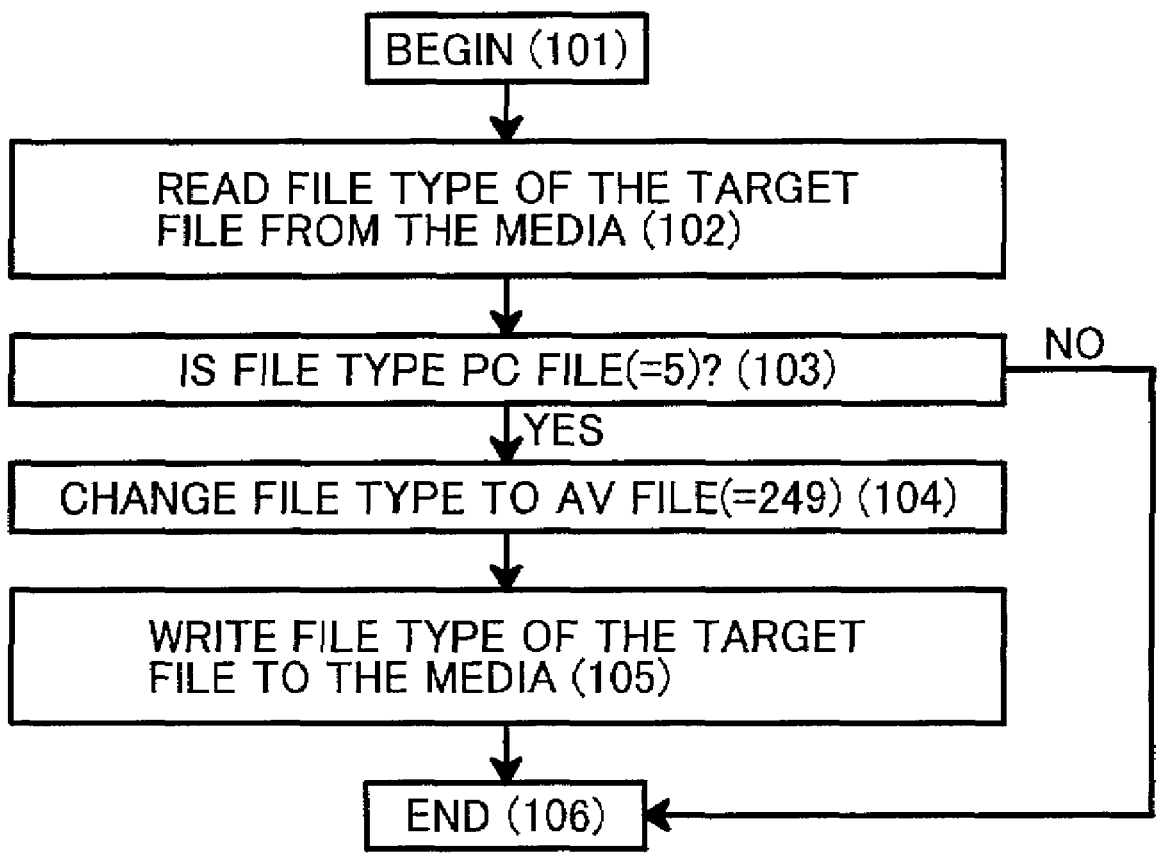
FIG. 1 is a flowchart for explaining the processing contents of a first embodiment of the present invention.

Embodiments of the present invention will be explained by referring to the attached drawings. Explanation will first be made as to a logical data structure 204 in a recording medium 201 which is a common part of the embodiment of the present invention and the earlier-mentioned prior art, with use of FIG. 2. In the drawing, the aforementioned file system (subset of the ISO/IEC13346 Standards) for DVD-RAM is formed in a part between a lead-in 205 and lead-out 213 defined in a recording medium physical layer. In the file system, information indicative of attributes of the entire recording medium is included in volume management information 206. In the drawing, a directory structure starting with Root is illustrated as if all were stored in the volume management information 206. However, this is merely a model representation for easy understanding of the present invention, and in actuality, the directory information and the like are stored in the form of a file structure using file entry or the like which will be explained later. The volume management information 206 is not associated directly with the operation of the present invention and thus explanation thereof is omitted.

As the volume management information 206 is traced by a known method, a space bitmap descriptor 207 for management of a blank area 212 in the recording medium 201 or file entries 209 and 211 for management of files can be read out. As mentioned above, the file entries 209 and 211 have a 1:1 relation with file bodies 208 and 210 respectively. File type 214 indicative of a PC or AV file is stored in each of the file entries 209 and 211.

FIG. 1 shows the processing contents of a first embodiment of the present invention. In the drawing, the apparatus of the present invention starts with the operation of a step 101 and goes to a step 102 to read a file type of a file to be processed from a recording medium. The 'file to be processed' as used therein means a file which has mixedly the AV mode recorded part 215 and the PC mode recorded part 216 and which has the file type 214 set to be a PC file as shown in FIG. 2. Or when it is expected for the file to be read in the AV mode in the years ahead, as when the file is set to have a specific file name or extension name (such as *.MPG, *.MP2, *.VOB, *.AOB, *.VRO, *.ARO, *.SRO or the like) in accordance with video recording specifications or audio recording specifications prescribed for each recording medium, the file having fully the PC mode recorded part 216 alone may be used as the file to be processed. In a net step 103, next, the apparatus judges whether or not the read file type is PC file. When the file type is the PC file, the apparatus proceeds to a step 104; whereas when the file type is not the PC file, the apparatus proceeds to a step 106. When the file type of the PC file is now previously defined, e.g., as '5', the apparatus can perform the above judgement by comparing the value of the read file type with 5. Through the judgement, it can be avoided that the apparatus erroneously process a file (e.g., a file indicative of the structure of 'directory') not associated with the operation of the present invention. In the step 104, the apparatus changes the file type to the AV file and goes to a step 105. At this time, when the file type of the AV file is previously defined, e.g., as '249', the apparatus changes the value of the file type to 249. In the step 105, the apparatus writes the file type of the file to be processed in the recording medium and terminates its operation in a step 106. In this connection, the judgement of the file type in the step 103 may be omitted as necessary.

Figure 3:
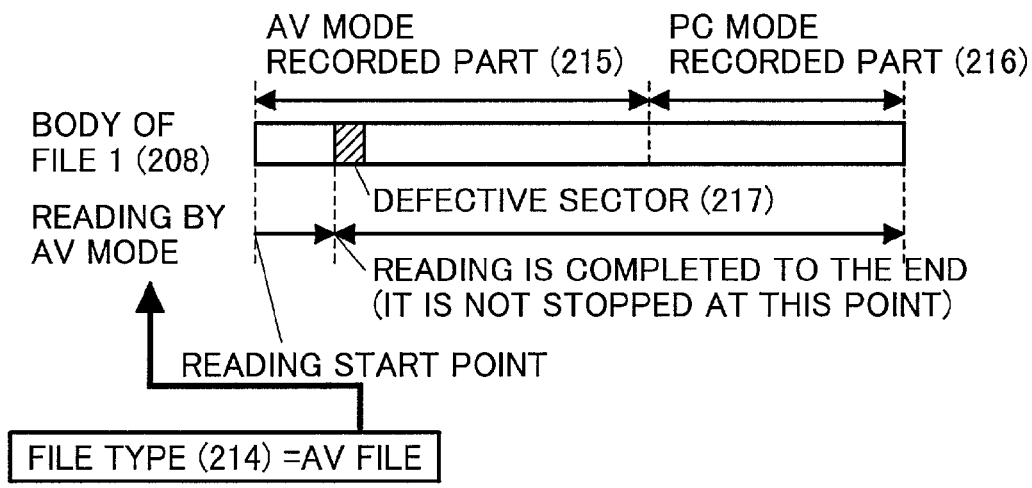
FIG. 3 is a diagram for explaining the operation of the first embodiment of the present invention.

Explanation will be made as to the operational principle of the first embodiment, by referring to FIGS. 3 and 4. FIG. 3 shows the operation of the apparatus when changed the file type 214 from the PC file to the AV file according to the processing contents of FIG. 1 with respect to a file body 208 having a defective sector 217 in the AV mode recorded part 215 as shown in FIG. 2. In FIG. 3, the drive unit and file system driver designed for the AV mode reading starts with the reading operation of the AV mode according to the aforementioned file type (AV file). As mentioned above, when the apparatus reads the file in the AV mode, the apparatus will not abnormally end even when reading the defective sector 217 and can continuously read the data regardless of a read error which occurs during this reading operation. Similarly, since the apparatus can continuously read the data of even the PC mode recorded part 216, the apparatus can read the data to the end of the file without a hitch.

Figure 4:
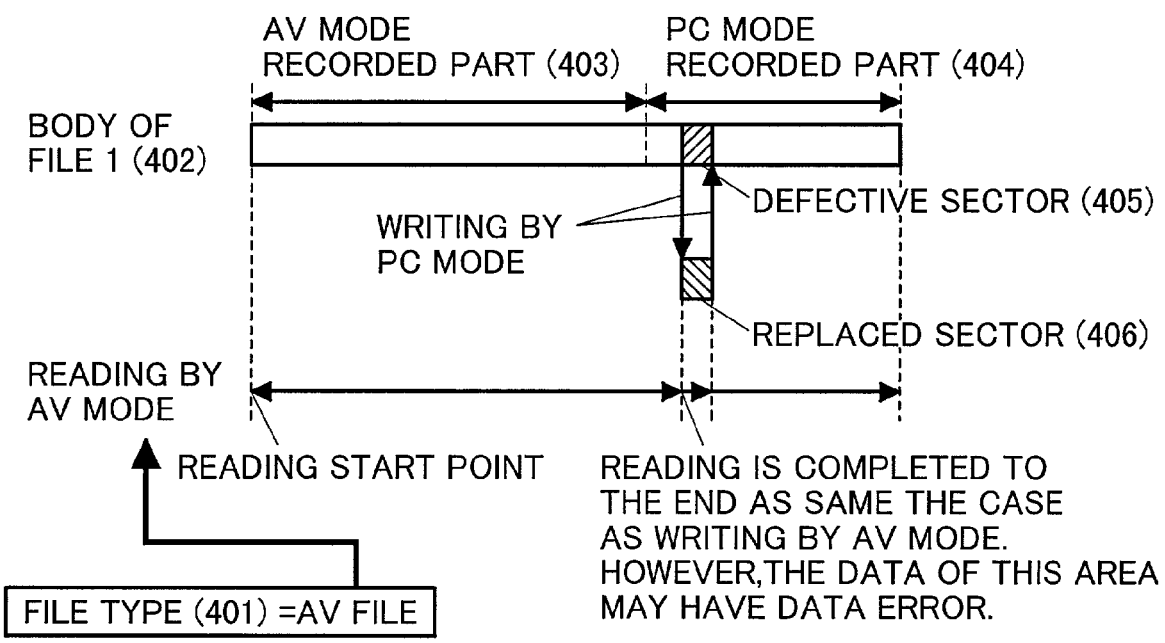
FIG. 4 is a diagram for explaining the operation of the first embodiment of the present invention.

FIG. 4 shows the operation of the apparatus when changed a file type 401 from the PC file to the AV file according to the processing contents of FIG. 1 with respect to a file body 402 which has no defective sector in an AV mode recorded part 403 but has a defective sector 405 in a PC mode recorded part 404. When the apparatus writes a file in the PC mode as mentioned above, the apparatus writes the data not in the defective sector 405 but in a replacement sector 406 previously prepared in another area on the same recording medium. When the apparatus reads this part in the AV mode, this means that the apparatus reads not the contents of the replacement sector but the defective sector containing erroneous data as it is. The value in this range (subjected to the replacing operation) contains a data error, but the apparatus will not abnormally end on the way and can read the file to its end without a hitch. In this connection, even in the case where the apparatus wrote the data in the AV mode, when the apparatus reads the data of the defective sector 405 in the AV mode, the read data contains the data error, which results in a similar result to when the apparatus recorded the data in the PC mode mentioned above.

In general, there exist mixedly in a single file body such a defective sector 217 or 405 and a replacement sector 406 as shown in FIGS. 3 and 4. Even in any mixed condition, the apparatus will not abnormally end halfway and can read the file at its end without a hitch according to the processing contents of FIG. 1.

FIG. 5 collectively shows the features of PC and AV files for comparison. The file entry 209 for file management contains the aforementioned file type 214 and a non-relocatable flag 501 to be explained later. It is common practice that the file type 214 is set to '5'0 for the PC file and to '249' for the AV file as mentioned above. It is also common that the non-relocatable flag 501 is set to '0' (relocatable) for the PC file and to '1' (non-relocatable) for the AV file. Further, with regard to the file body 208 for storage of the actual data part of a file, the state 502 of an ECC block to be explained later varies from file to file and the ECC block in which PC file is stored may be shared with other files. However, it is common practice that the AV file is inhibited to be used mixedly with another file. With respect to a file tail 503 which is logically continuous to the file body 208 but has no significant recorded data, the necessity of a stuffing 504 within an ECC block to be explained later varies from file to file. In this case, it is common practice that the stuffing is unnecessary for the PC file but it is indispensable for the AV file.

The non-relocatable flag 501 will be explained with reference to FIGS. 6A, 6B and 7. In FIG. 6A, an ordinary video and/or audio reproducing device reads data recorded in a recording medium 601 through a data reproducing system 602 (optical head, etc.) and writes the read data in a buffer 603 at a data rate Vo. Meanwhile, the device reads the data from the buffer 603 at the data rate Vo, and inputs the read data in a video and/or audio decoder 604 of a MPEG (moving picture experts group) type or the like to eventually obtain a video signal or audio signal. The details of the data reproducing system 602 and decoder 604 are not illustrated for simplicity of the drawing.

Shown in FIG. 6B is an example of operation of the buffer 603. In the drawing, the amount of data in the buffer 603 is gradually increased at a rate Vr–Vo in a data reading time Tr from the recording medium 601, whereas, the amount of data in the buffer 603 is gradually decreased at a rate –Vo in a time (which will be referred to as the jump time Tj, hereinafter) during which the data cannot be read due to seeking or the like. When next reading operation starts before the amount of data in the buffer 603 reaches zero, the data supply to the decoder 604 cannot be interrupted and seamless reproducing operation can be realized. When the data continuous reading time Tr continues long and the data is read to an extent of the full memory capacity (or full buffer size) of the buffer 603 becomes full, data cannot be read into the buffer 603 any more, which causes a so-called kickback that the disk is rotated with idling, during which the amount of data in the buffer 603 is made somewhat smaller than the buffer size. Meanwhile, when the jump time Tj continues long, the data in the buffer 603 to be supplied to the decoder is fully consumed, which results in generation of an underflow phenomenon that a resulting video or audio signal is intermitted.

The aforementioned non-relocatable flag 501 is a flag defined for the purpose of preventing such underflow. When the flag is set to '0', the recording position of the file body in the recording medium can be moved without any limitation. When the flag is set to '1', on the other hand, the movement of the recording position of the file body in the recording medium is inhibited.

Figure 7:
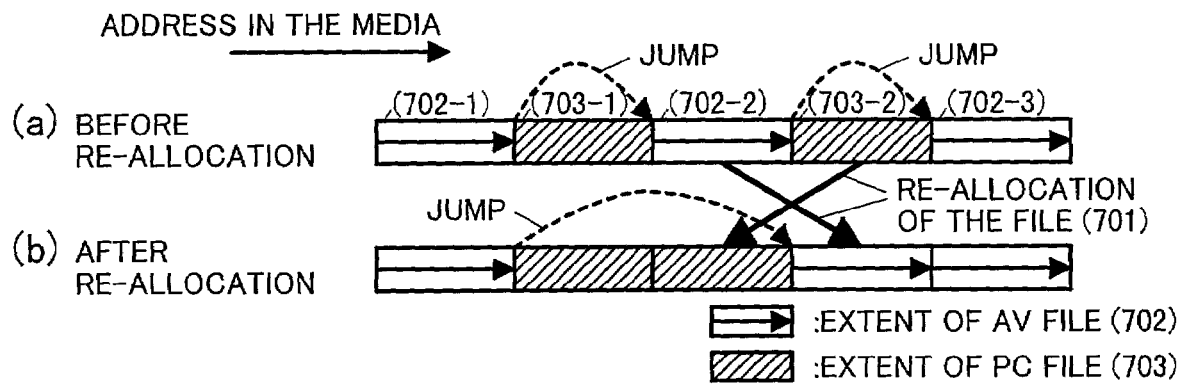
FIG. 7 is a diagram for explaining the operation of file relocation processing.

Assume for example that, as shown in FIG. 7, an AV file 702 was recorded by the aforementioned video recorder 202 on the recording medium having a PC file 703 already recorded thereon. Then as shown in FIG. 6, the positions of extents 702-1, 702-2 and 702-3 of the AV file are determined, usually while giving consideration that, even when extents 703-1 and 703-2 of the PC file are jumped in the reproduction mode, the read result of the AV file 702 will not subjected to underflow.

There has been already spread such file utility software that has a function (which will be referred to as the defragmentation function, hereinafter) of collecting fragmented file bodies at one location and relocating them to speed up the access to the file. Thus it is considered using such software to perform such file relocating operation 701 as shown in FIG. 7 to collect the extents 703-1 and 703-2 of the PC file at one location. Similarly, when defragmentation is carried out over the extent 702-2 of the AV file, a gap between the extents 702-1 and 702-2 becomes large, which might lead to generation of the aforementioned underflow. To avoid this, the above non-relocatable flag 501 is usually set to '1' so that defragmentation operation will not be carried out over the AV file.

Figure 8:
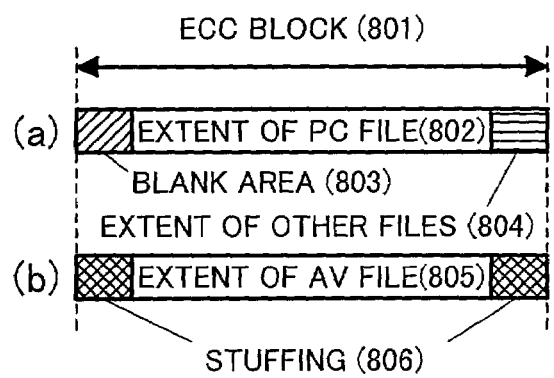
FIG. 8 shows diagrams for explaining the operations of PC and AV files.

Explanation will be made as to the state 502 of the ECC block with reference to FIG. 8 showing a file location state in the ECC block. In the drawing, (a) is for a PC file and (b) is for an AV file. As already mentioned above, data writing is carried out on every sector basis. Thus, the interior of the ECC block made of a plurality of sectors (e.g., 16 sectors) combined as an error correction processing unit not only may have an extent 802 of the PC file recorded therein but also have a blank area 803 at the head or tail part of the file and extents 804 of other file mixedly placed within the same ECC block. Even when no defect occurs at the time of writing data into an ECC block 801, a write error takes place at the time of newly writing data into the blank area 803 or the extent 804 of the other file, thus causing the aforementioned replacement processing. In order to avoid this, such a measure is usually taken as to insert stuffings 806 in the ECC block having an extent 805 of an AV file written therein as shown in FIG. 8, (b) to avoid writing operation in the PC mode which may undesirably cause the replacement processing. Accordingly, when the file type is changed from the PC file to the AV file as shown in FIG. 1, it is necessary to consider even the above stuffing insertion processing.

Figure 9:
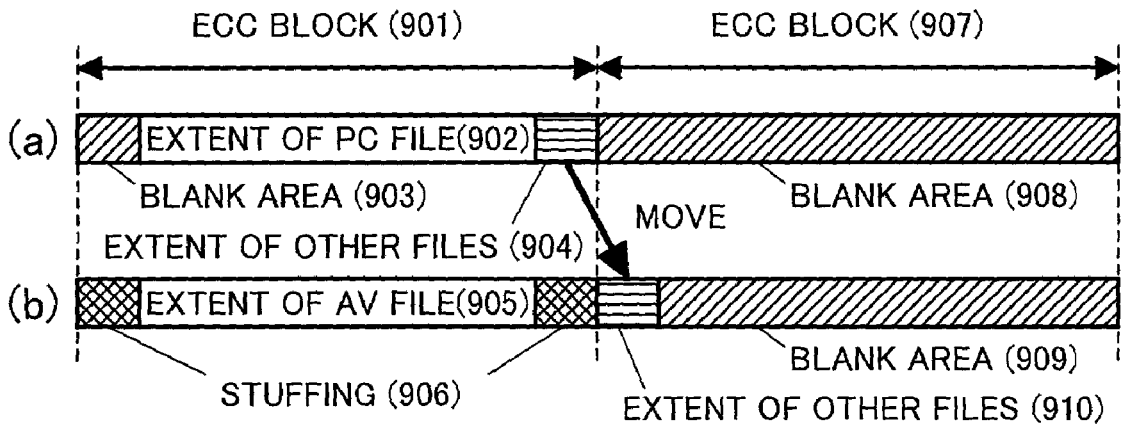
FIG. 9 shows diagrams for explaining the operation of a second embodiment of the present invention.

Explanation will be made as to the operation of the stuffing processing in the present invention by referring to FIGS. 9 and 10. First shown in FIG. 9 is an example of operation of the stuffing insertion processing, when a single ECC block 901 has an extent 902 of a PC file, a blank area 903, and extents 904 of other files mixedly and when the extents 904 of the other files are moved into another ECC block 907. When the file type is changed from the PC file to the AV file as mentioned above, it is necessary to insert stuffings into remaining sectors 906 of the ECC block having the extents of the AV file already recorded therein. At this time, the extent 902 of the PC file of FIG. 9, (a) can be an extent 905 of the AV file in the other ECC block at the same recording position as the ECC block 901. However, it is necessary to make blank the extents 904 of the other files and insert the stuffings 906 therein. For this reason, it is required to once read the contents of the data of the extents 904 of the other files, find a blank area 908 of the other ECC block 907 and then write the data contents therein to thereby create a new extent 910. In this connection, it is unnecessary for the ECC block 907 for writing of the new extent 910 to have all blank area sectors. That is, the ECC block 907 may have a blank area 909 and an extent of the other files as shown in FIG. 9, (b), or the data contents of the extent 902 may be dividedly written into a plurality of ECC blocks. How to find a blank area and the detailed stuffing inserting method will be explained.

Figure 10:
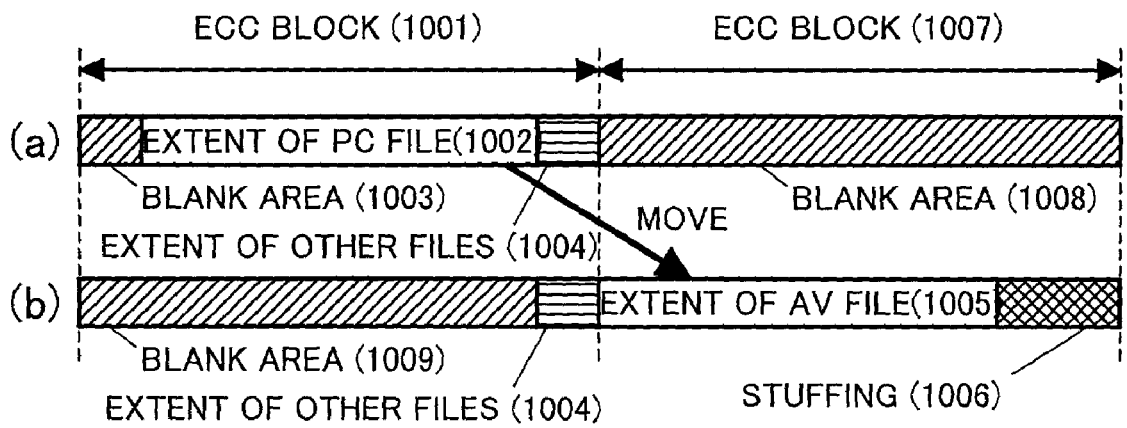
FIG. 10 shows diagrams for explaining the operation of a third embodiment of the present invention.

Shown in FIG. 10 is an example of operation of the stuffing insertion processing, when a single ECC block 1001 has an extent 1002 of a PC file, a blank area 1003 and an extent 1004 of other files mixedly and when the extent 1002 of the PC file is moved into another ECC block 1007. In this case, a new extent 1005 is created by once reading the data contents of the extent 1002 of the PC file in FIG. 10, (a), finding the ECC block 1007 having a blank area, and then writing the data contents therein. At this time, since it is necessary to insert a stuffing 1006 in a remaining sector 1006 of the ECC block 1007 as a movement target, all sectors in the ECC block 1007 are required to be blank. In this connection, the new extent 1005 is not required to be written from its head sector. That is, the new extent may be written from an intermediate sector of the ECC block or written as extended to another ECC block. However, stuffings are required to be inserted into all the remaining sectors of the ECC blocks having the extent of the AV file written therein. Further, it is unnecessary to change the position of the extent 1004 of the other files from its original position, and a new blank area 1009 can be freely used thereafter.

Figure 11:
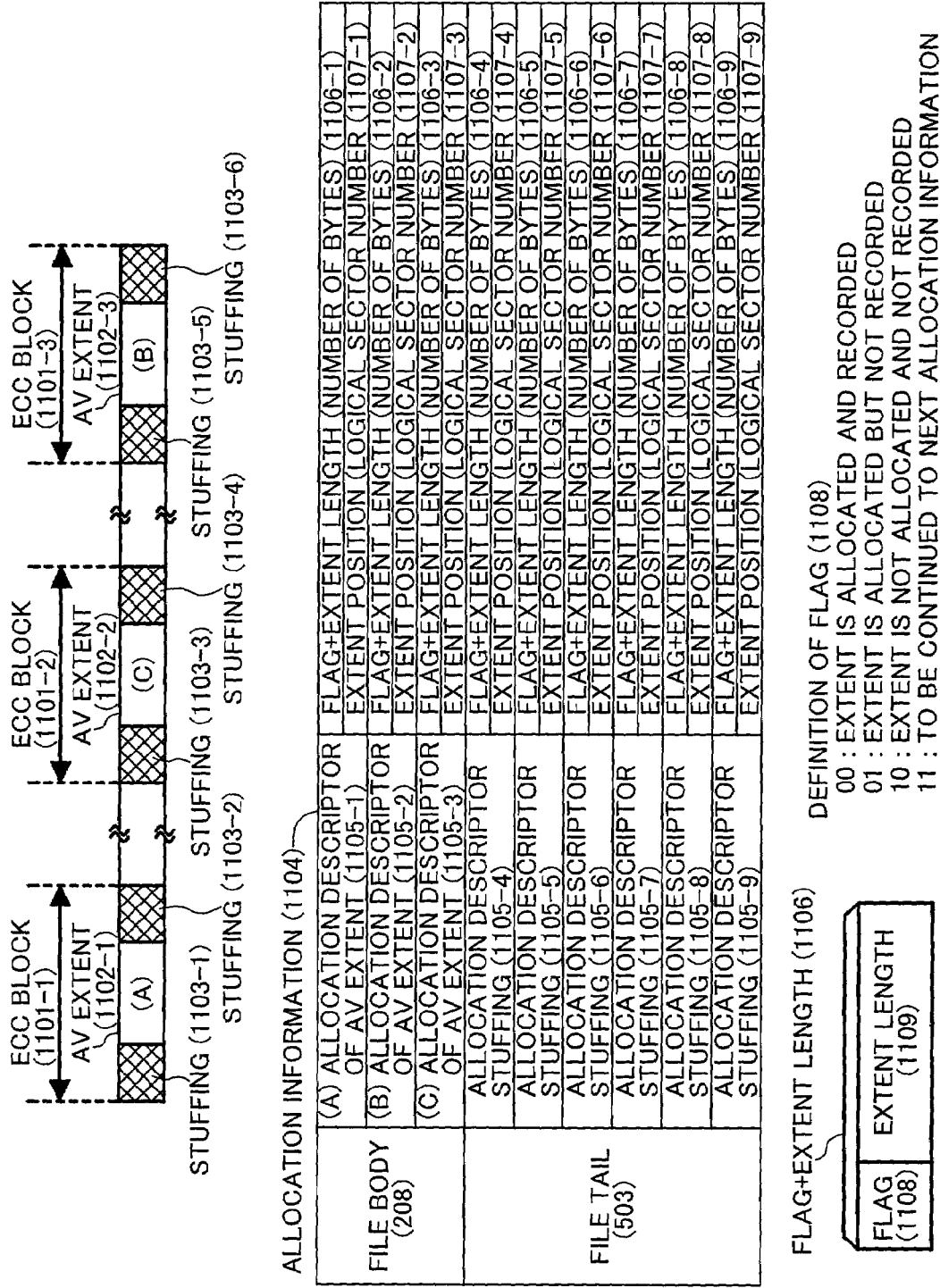
FIG. 11 shows diagrams for explaining general file allocation information.

Explanation will be made as to data allocation information of a file extent and a specific stuffing insertion method by referring to FIG. 11. In the drawing, an extent of an AV file will be referred to as the AV extent, hereinafter. In the same drawing, it is assumed that a single AV file is already written as divided into three AV extents 1102-1, 1102-2 and 1102-3 and that stuffings 1103-1, 1103-2, 1103-3, 1103-4, 1103-5 and 1103-6 are already recorded in the ECC blocks 1101-1, 1101-2 and 1101-3 having respective AV extents written therein, respectively. It is also assumed for easy understanding of explanation that the respective AV extents are written in the order of (A), (B) and (C) and addresses in the file are determined in this order. Information about the allocations of the extents and information about the order are usually included in file entries in the form of such allocation information 1104 as shown in FIG. 11. In the allocation information 1104, an allocation descriptor 1105 of the AV extent 1102 having significant data recorded therein is first stored as information on the file body 208 and then the allocation descriptor 1105 of the stuffing 1103 is stored as information on the file tail 503. Each allocation descriptor 1105 includes information 1106 on flag+extent length (to be explained later) and an extension position 1107 indicative of the storage position of the extent represented in terms of a logical sector number. The file body 208 is stored in the extent writing order of (1102-1), (1102-3) and (1102-2). The file tail 503 may be stored in any order regardless of the order of the stuffing 1103. The (flag+length) information 1106 includes a flag 1108 (to be explained later) and length information 1109 indicative of the extent length represented in terms of the number of bytes. The flag 1108 usually consists of two bits by the value of which an extent is allocated. The flag usually has four defined values, that is, "00" means that an extent is allocated and recorded, "01" means that an extent is allocated but not recorded, "10" means that an extent is not allocated and not recorded, and "11" means that an extent is continued to next data allocation information. A distinction between the file body 208 and file tail 503 can be realized by associating the value "00" with the AV extent and the value "01" with the stuffing. Further, at the time of inserting the stuffing, the stuffing insertion processing can be easily realized by adding a new allocation descriptor 1105 having the flag 1108 set to "01" to the end of the file tail 503. In this connection, the data contents of the extent position corresponding to the stuffing is arbitrary, that is, may be stuffed with "0" or the previous value may remain there.

Figure 12:
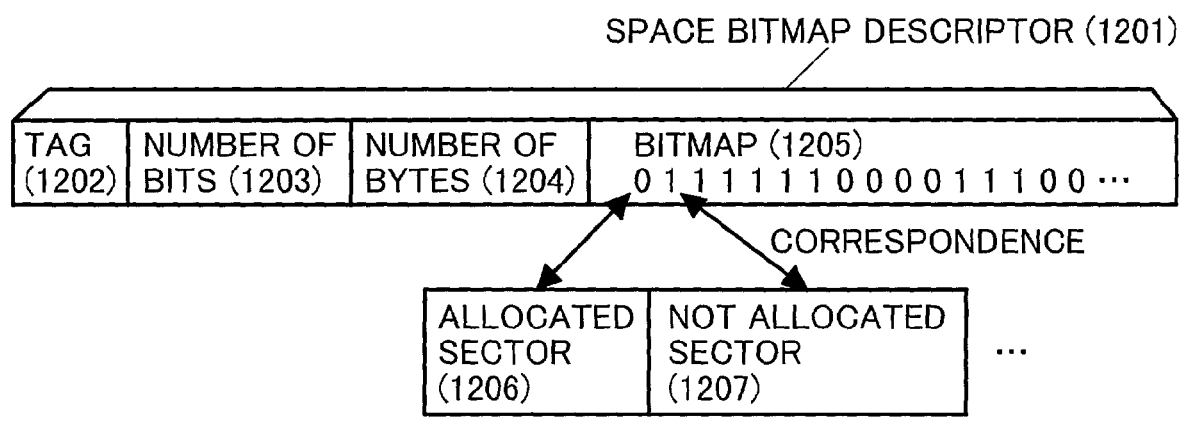
FIG. 12 is a diagram for explaining general Space Bitmap Descriptor.

By referring to FIG. 12, explanation will be made as to the particular contents of a space bitmap descriptor 1201 and how to search a blank area. The space bitmap descriptor 1201 usually includes a tag 1202 indicative of the fact of being the space bitmap descriptor, a bit map 1205 (to be explained later), a bit number 1203 indicative of the number of bits to show the size of the bit map 1205, and a byte number 1204 indicative of the number of bytes necessary to store the bit map 1205. The respective bits of the bit map 1205 correspond to the contents of respective sectors within the recording medium, and the bit of a sector 1206 in use is set to "0" while the bit of a sector 1207 in no use is set to "1" respectively. When it is desired to find a blank area on a sector basis in the processing of FIG. 9, the finding of a blank sector can be easily carried out, e.g., by searching the bit map 1205 for a bit having "1" set therefor from its head and converting it to a logical sector number corresponding to its bit position. Further, when it is desired to find a blank area on an ECC-block basis in the processing of FIG. 10, the finding of a blank ECC block can be easily realized, e.g., by previously finding a bit position corresponding to an ECC block boundary (for example, a sector having a logical sector number represented by a multiple of 16 sectors in the bit map 1205, searching for a position until which bits counted from the previously-found bit position by a number corresponding to the size (e.g., 16 bits) of the above ECC block are set all to "1", and then converting the searched bit position to a corresponding logical sector number.

Figure 13:
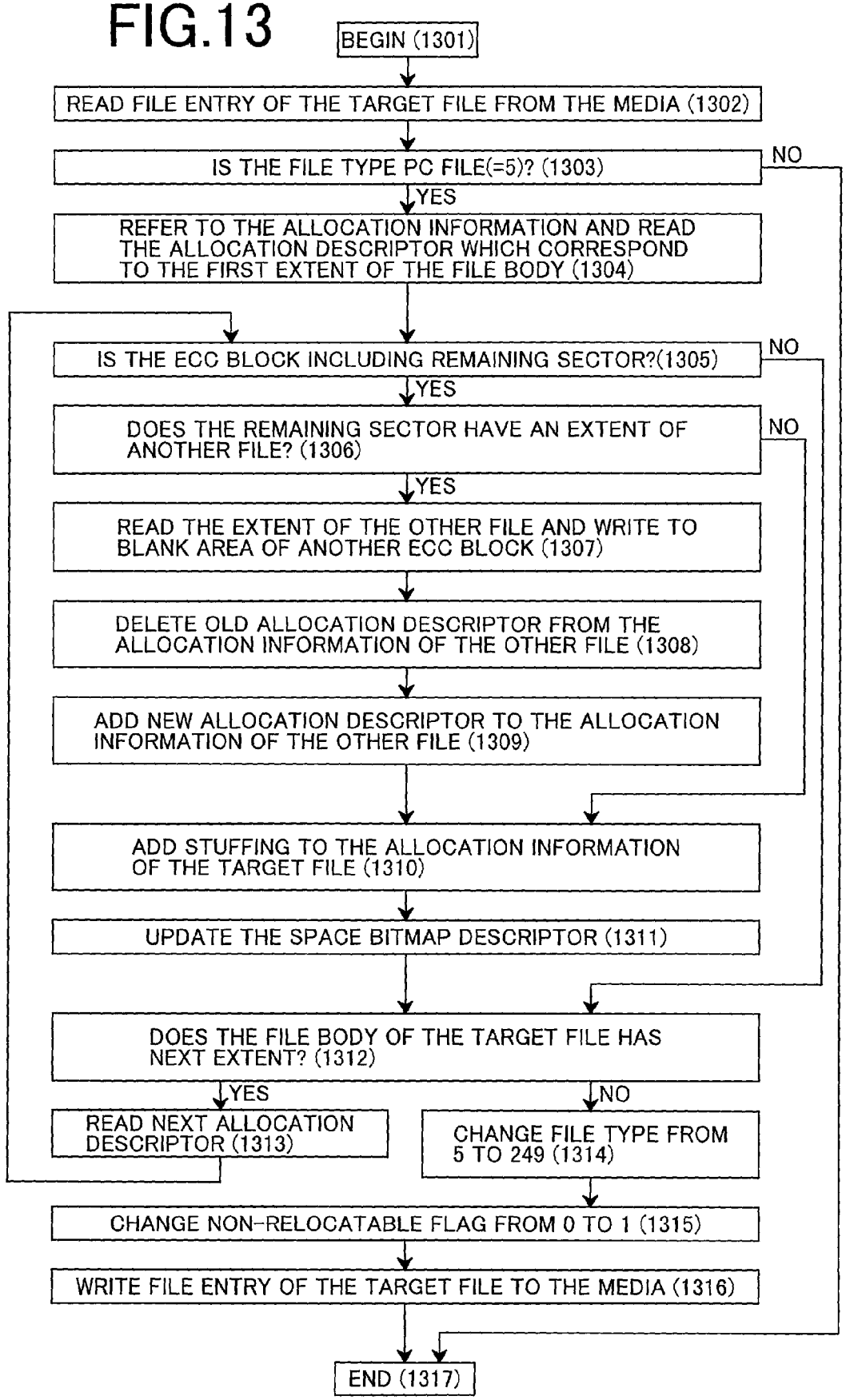
FIG. 13 is a flowchart for explaining the processing contents of the second embodiment of the present invention.

FIG. 13 shows the processing contents of a second embodiment of the present invention. The drawing corresponds to an extension of the processing contents of FIG. 1 when the apparatus performs such stuffing insertion processing as shown in FIG. 9 on the basis of the feature comparison between the PC and AV files shown in FIG. 5. In the same drawing, the apparatus starts its operation in a step 1301 and reads the file entry 209 of a file to be processed from the recording medium at a step 1302. In a next step 1303, the apparatus judges whether or not the file is a PC file by referring to the file type 214 stored in the file entry 209. When the file is a PC file, the apparatus proceeds to a step 1304, whereas, when the file is not a PC file, the apparatus proceeds to a step 1317. As necessary, the step 1303 can be omitted. In the step 1304, the apparatus refers to the allocation information 1104 stored in the file entry 209 and reads the allocation descriptor 1105 corresponding to the extent 1102 firstly allocated in the file body. In a subsequent step 1305, the apparatus refers to the extension position 1107 within the allocation descriptor 1105 and judges whether or not the blank area 903 or 904 is included in the ECC block 901 where the extent 1102 as a target is recorded. When the blank area is included, the apparatus goes to a step 1306, whereas, when the blank area is not included, the apparatus goes to a step 1312. In the step 1306, the apparatus judges whether or not the extents 904 of the other files are included in that remaining sector. If included, then the apparatus goes to a step 1307, whereas, if not then the apparatus goes to a step 1307. In the step 1307, the apparatus specifies a file or files to which the extents 904 belong as by searching for the contents of the file entries of all the files, reads contents of the extents 904 of the file (other files), and writes it in the blank area 908 of the other ECC block. In a subsequent step 1308, the apparatus the allocation descriptor as the movement originator from the data allocation information of the file (other files). In a next step 1309, the apparatus registers the allocation descriptor as a movement destination in the data allocation information of the file (other files). Through the steps 1307, 1308 and 1309, the extents of the other files can be moved. In a subsequent step 1310, the apparatus registers as the remaining sector 906 the remaining sector of the movement originator in the allocation information 1104 of the file to be processed. In a next step 1311, the apparatus updates the space bitmap descriptor 1201 by reflecting the extent movement by the steps 1307, 1308 and 1309 as well as the result of the stuffing insertion by the step 1310, and sets bits corresponding to a new used sector to '0'. In a subsequent step 1312, the Apparatus judges whether or not a next extent is present in the file body of the file to be processed. In the presence of the next extent, the apparatus proceeds to a step 1313, whereas, in the absence of the next extent, the apparatus proceeds to a step 1314. In the step 1313, the apparatus reads the next allocation descriptor 1105 and returns to the step 1305 to perform the aforementioned operations over all the allocation descriptors 1105. In the step 1314, the apparatus changes the file type 214 stored in the file body from "5" (PC file) to "249" (AV file). In a next step 1315, the apparatus changes the value of the non-relocatable flag 501 from "0" (relocatable) to "1" (non-relocatable). In a next step 1316, the apparatus writes the file entry 209 changed through the above steps in the recording medium and goes to a step 1317 to terminate its all operations.

Figure 14:
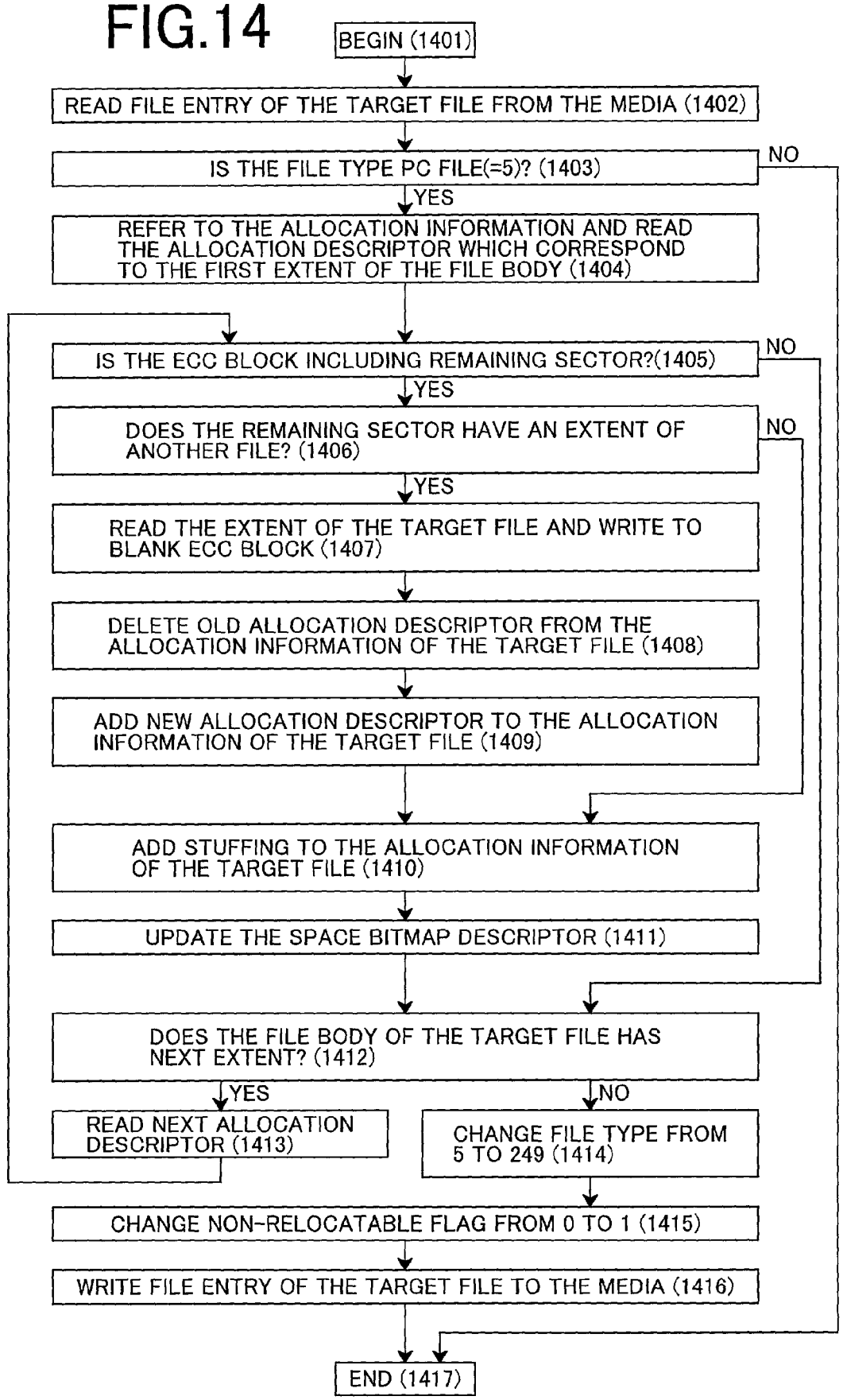
FIG. 14 is a flowchart for explaining the processing contents of the third embodiment of the present invention.

FIG. 14 shows the processing contents of a third embodiment of the present invention. The drawing is an extension of the processing contents of FIG. 1 when the apparatus performs such stuffing insertion processing as shown in FIG. 10 on the basis of the feature comparison between the PC and AV files shown in FIG. 5. In the same drawing, the apparatus starts its operation in a step 1401 and reads the file entry 209 of a file to be processed from the recording medium. In a next step 1403, the apparatus judges whether or not the file is a PC file by referring to the file type 214 stored in the file entry 209. When the file is a PC file, the apparatus proceeds to a step 1404, whereas, when the file is not a PC file, the apparatus proceeds to a step 1417. As necessary, the step 1403 can be omitted. In the step 1404, the apparatus refers to the allocation information 1104 stored in the file entry 209, and reads the allocation descriptor 1105 corresponding to the extent 1102 firstly allocated in the file body. In a next step 1405, the apparatus refers to the extension position 1107 within the allocation descriptor 1105 and judges whether or not the blank area 1003 or 1004 is included in the ECC block 1001 having the extent 1102 recorded therein as a target. When the blank area is included, the apparatus proceeds to a step 1406, whereas, when the blank area is not included, the apparatus proceeds to a step 1412. In the step 1406, the apparatus judges whether or not the extent 1004 of the other files is included in the remaining sector. When the extent is included, the apparatus proceeds to a step 1407, while, when the extent is not included, the apparatus proceeds to a step 1410. In the step 1407, the apparatus reads the contents of the extent 1002 of the file to be processed and writes it in the other blank ECC block 1007. In a subsequent step 1408, the apparatus deletes the allocation descriptor 1105 as a movement originator from the allocation information 1104 of the file to be processed. In a subsequent step 1409, the apparatus registers the allocation descriptor 1105 as a movement destination in the allocation information 1104 of the file to be processed.

Through the steps 1407, 1408 and 1409, the apparatus can move the extent 1002 of the file to be processed. In a next step 1410, the apparatus registers the remaining sector of the movement destination as the stuffing 1006 in the allocation information 1104 of the file to be processed. In a next step 1411, the apparatus updates the space bitmap descriptor 1201 by reflecting the extent movement by the steps 1407, 1408 and 1409 and the result of the stuffing insertion by the step 1410, sets a bit corresponding to a new used sector to "0", and sets a bit corresponding to a new not-used sector to "1". In a subsequent step 1412, the apparatus judges whether or not a next extent is present in the file body of the file to be processed. In the presence of the next extent, the apparatus proceeds to a step 1413; whereas, in the absence of the next extent, the apparatus proceeds to a step 1414. In the step 1413, the apparatus read the next allocation descriptor 1105 and returns to the step 1405 to perform the aforementioned operations over all the allocation descriptors 1105. In the step 1414, the apparatus changes the file type 214 stored in the file entry from "5" (PC file) to "249" (AV file). In a next step 1415, the a plurality of changes the value of the non-relocatable flag 501 from "0" (relocatable) to "1" (non-relocatable). In a next step 1416, the apparatus writes the file entry 209 changed by the above step in the recording medium and terminates its all operations in a step 1417.

Figure 15:
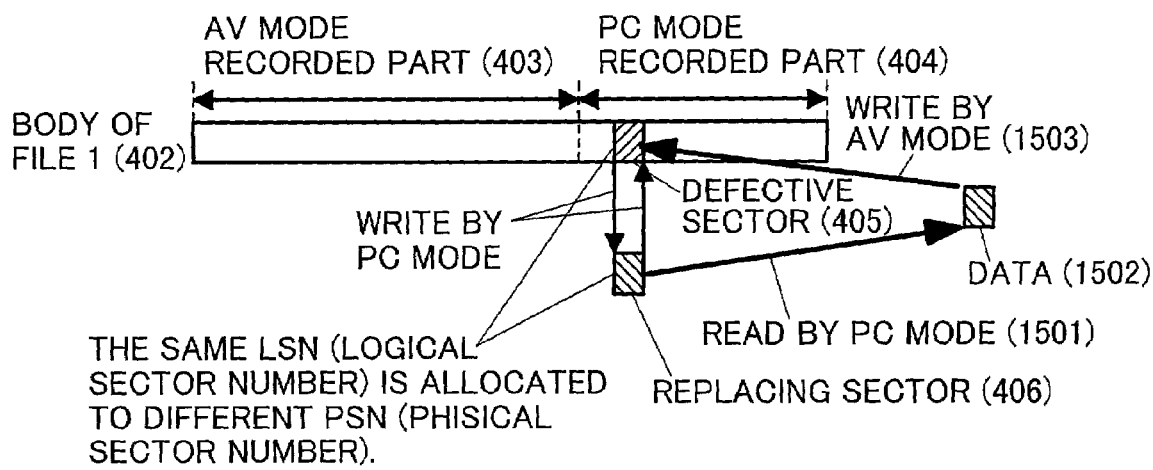
FIG. 15 is a diagram for explaining the operation of a fourth embodiment of the present invention.

FIG. 15 is a diagram for explaining the operation of a fourth embodiment of the present invention. The drawing explains how to improve data reliability when the apparatus reads the PC mode recorded part 404 in the AV mode. As shown in FIG. 4, when the defective sector 405 is present in the PC mode recorded part 404, the apparatus performs its replacement processing at the time of writing the data in the PC mode to write the data in the replacement sector 406. Since the reading of this part in the AV mode involves reading of the contents of the defective sector 405, there is a high possibility that data completely different from the latest contents written in the replacement sector 406 may be read. As mentioned above, the replacement processing is usually carried out on an ECC-block basis and thus, in many cases, a defect is included not in all the sectors but in only part of the sectors. Accordingly, when the apparatus reads data 1502 of the replacement sector 406 and writes it in the defective sector 405, the apparatus may read right data in the AV mode with respect to some of the sectors. Since the defective sector 405 and replacement sector 406 are allocated on the recording medium at different locations, different physical sector numbers (PSN's) are allocated to the defective and replacement sectors. When logical sector numbers (LSN's) corresponding to the PSN's are assigned to the sectors, however, the apparatus can access the data of the replacement sector 406 in the PC mode and can access the contents of the defective sector 405 in the AV mode. Accordingly, when the apparatus specifies the same logical sector number to read the data 1502 in the PC mode in the step 1501 and thereafter writes the data in the PC mode in the step 1503, the data reliability when the apparatus next reads the data in the AV mode can be improved.

Figure 16:
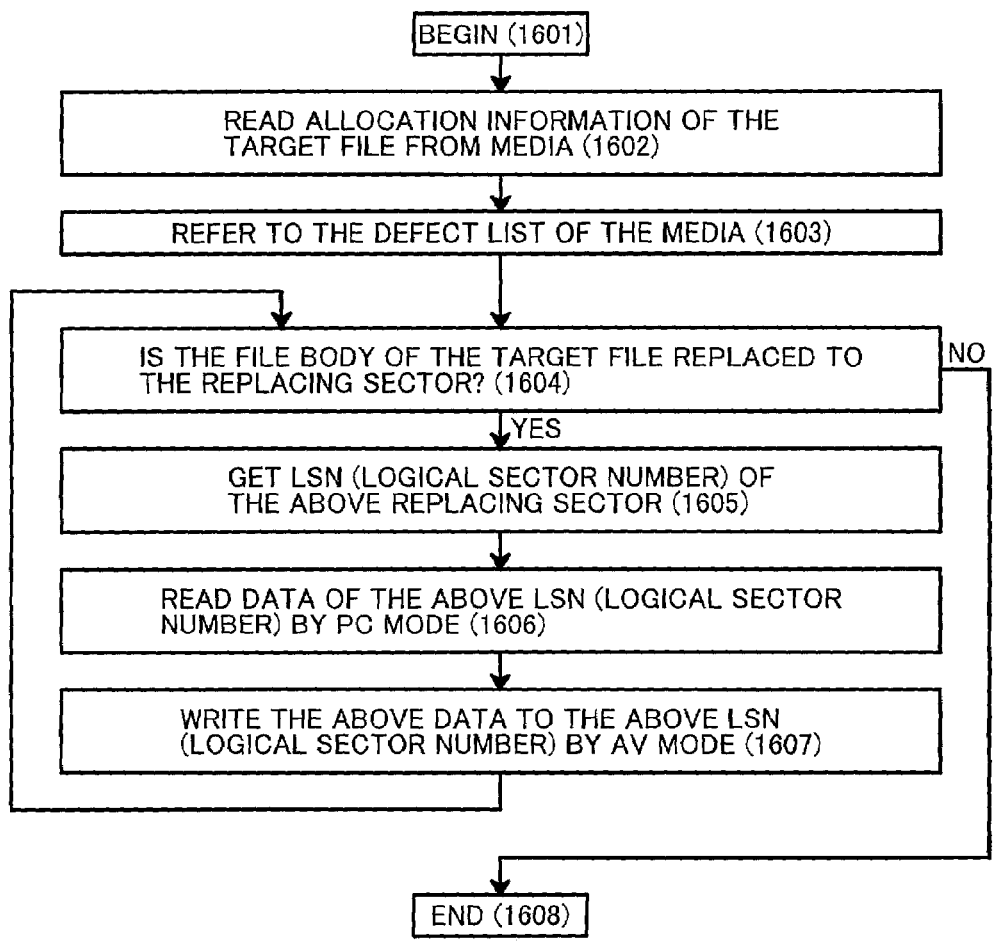
FIG. 16 is a flowchart for explaining the processing contents of the fourth embodiment of the present invention.

FIG. 16 shows details of the aforementioned steps 1501 and 1503. In the drawing, the apparatus starts its operation in a step 1601 and proceeds to a step 1602 to read the allocation information 1104 of the file to be processed from the recording medium. In a next step 1603, the apparatus refers to a defective list of the recording medium. The defective list, which is usually defined in the physical layer of the recording medium), includes information about positions of registered defective sectors and positions of their replacement sectors in the form of a table. In a next step 1604, the apparatus, with use of the data allocation information 1104 read in the step 1602 and the defective list referred to in the step 1603, judges whether or not the file body of the file to be processed is registered in the replacement sector. When the file body is registered, the apparatus proceeds to a step 1605, whereas, when the file body is not registered, the apparatus proceeds to a step 1608. The apparatus finds, in the step 1605, the logical sector number (LSN) of the replacement sector judged to have the file body recorded therein in the step 1604, reads the data 1502 recorded in the logical sector number (LSN) in the PC mode in a step 1606, and then records the data 1502 for the logical sector number (LSN) in the AV mode in a step 1607. Thereafter the apparatus returns to the step 1604 and performs its operations over all the file bodies recorded in the replacement sectors. In a step 1608, the apparatus terminates its operation. Through these steps, the apparatus can realize the operations shown in FIG. 15.

Figure 17:
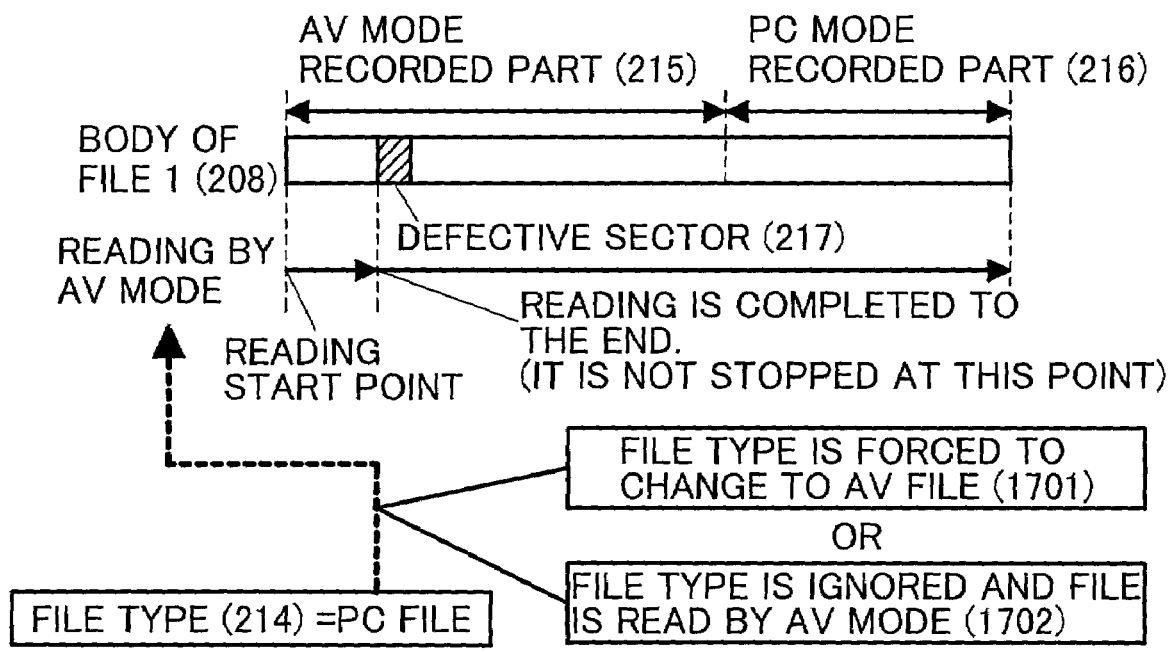
FIG. 17 is a diagram for explaining the operation of a fifth embodiment of the present invention.

FIG. 17 is a diagram for explaining the operation of a fifth embodiment of the present invention. In the drawing, even in the case where the file type 214 of the file to be processed indicates a PC file, if the apparatus forcibly regards the file type 214 as an AV file to read the file to be processed as in a step 1701, or if the apparatus ignores the file type 214 and reads the file to be processed in the AV mode as in a step 1702, the apparatus can read both of the AV mode recorded part 215 and PC mode recorded part 216 to the end of the file without causing the abnormal end, even when the file body 208 contains the defective sector 217. However, since this method changes the file type 214, this will not change the operation of an apparatus (another apparatus) not using this method.

Figure 18:
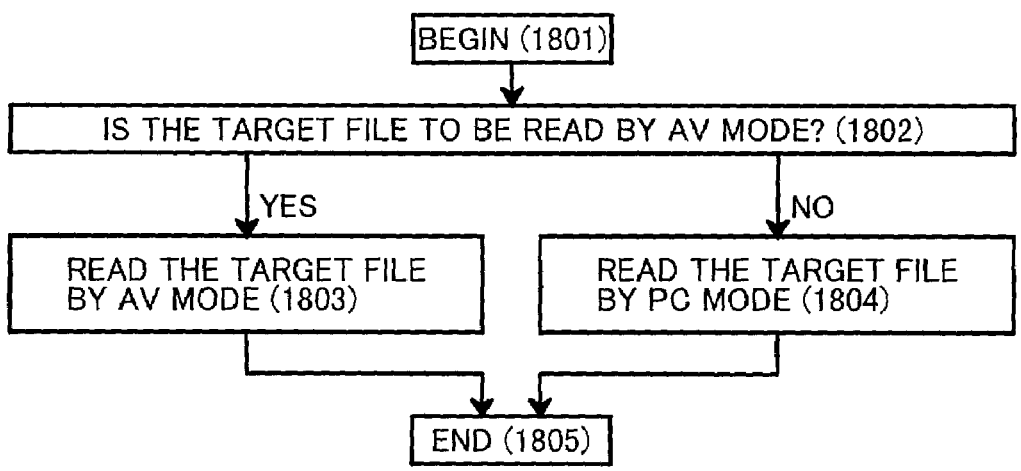
FIG. 18 is a flowchart for explaining the processing contents of a sixth embodiment of the present invention.

FIG. 18 shows the processing contents of a sixth embodiment which realizes operation similar to that of the step 1701 or 1702. The apparatus starts its operation in a step 1801 and judges whether or not the file to be processed is a file to be read in the AV mode in a next step 1802. At this time, the apparatus judges that, as when the file is set to have a specific file name or file extension name (such as *.MPG, *.MP2, *.VOB, *.AOB, *.VRO, *.ARO or *.SRO) according to a Standard such as a video or audio recording Standard prescribed for each recording medium, the file should be read in the AV mode. Alternately, the apparatus may not specify the file to be processed and, at the time point of reading it from the recording medium, the apparatus performs the above judgement over the file name or extension name of the file. Or the apparatus may previously specify the file to be processed and perform the above judgement prior to reading of the file name or extension name of the file from the recording medium. On the contrary to the above, the apparatus may previously specify the files to be read in the PC mode and judge that files other than the previously-specified files should be read in the AV mode. When judging to read it in the AV mode in the step 1802, the apparatus proceeds to a step 1803; while, when judging not to read it in the AV mode, the apparatus proceeds to a step 1804. In the step 1803, the apparatus reads the file to be processed in the AV mode. In the step 1804, the apparatus reads the file to be processed in the PC mode and terminates its operation in a step 1805. Through these steps, the apparatus can read the file to be processed in the suitable mode regardless of the contents of the file type 214.

Figure 19:
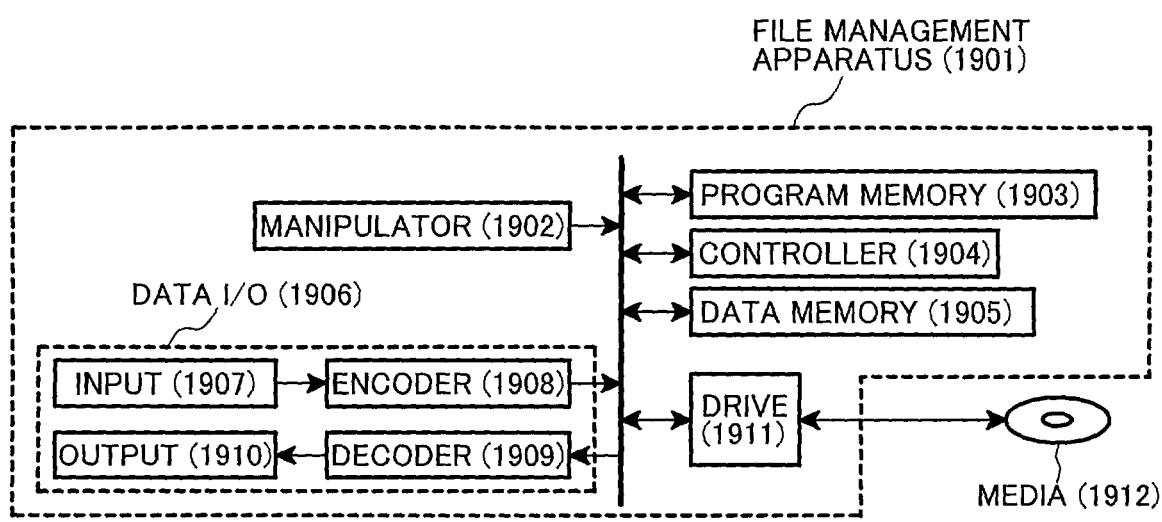
FIG. 19 shows a configuration of a seventh embodiment of the present invention.

FIG. 19 shows a configuration of a seventh embodiment of the present invention. In the drawing, a file management apparatus 1901 reads/writes a file from/to a recording medium 1912, writes the aforementioned file type, writes a file entry, writes data allocation information, or writes space bitmap descriptor. In the file management apparatus 1901, on the basis of an instruction received from a program memory 1903 which stores the steps shown in FIGS. 1, 13, 14, 15, 16, 17, 18, and . . . as a program, a controller 1904 performs control over the entire apparatus. The controller control the reading of data (such as the file type) necessary for execution of the above steps from the recording medium 1912 via a drive 1911 to a data memory 1905 or the writing of data generated based on the above steps from the data memory 1905 via the drive 1911 to the recording medium 1912. At this time, a manipulator 1902 for control with use of a keyboard, mouse, remote controller or the like may be provided so that a user's instruction causes the apparatus to start, interrupt resume, and terminate the above control. There may also be provided a data I/O 1906 which includes an input 1907, an encoder 1908, a decoder 1909 and output 1910, so that the file management apparatus 1901 can record video or audio data on the recording medium or reproduce it from the recording medium. For example, the input 1907 may be provided with a video camera, a broadcasting tuner or a video signal input terminal to form a video recorder; or the output 1910 may be provided with a video monitor or a video signal output terminal to form a video player. The above encoder 1908 or decoder 1909 can employ, in addition to the MPEG or JPEG (Joint Photographic Experts Group) format defined based on the ISO/IEC Standards, an encoding/decoding means such as PCM (Pulse Coded Modulation) format of mere conversion to binary number, or any format generally well known, and thus it is not illustrated in the drawing. Further, the program memory 1903 and data memory 1905 may be combined into a single memory. Or the program memory 1903 may be a nonvolatile memory and the data memory 1905 may be a volatile memory.

In this connection, the aforementioned writing of the file type, file entry, data allocation information and space bitmap descriptor may be carried out all in the PC mode. Further, although the above recording medium has been explained in connection with the DVD-RAM as an example, the present invention is not limited to the specific example. For example, the present invention can be applied regardless of the type of the recording medium such as an optical disk, magneto-optical disk (MO disk) and magnetic disk (HDD: hard disk drive) or even when the recording medium is a removable recording medium (open recording medium) or non-removable recording medium (closed recording medium). The present invention can be widely applied to a system wherein there are mixedly present data recorded in an operation mode in which a data reliability is essential and data recorded in an operation mode in which a data transmission rate is essential in a signal file on a recording medium.

In accordance with the foregoing embodiments, even when the apparatus record data with use of a drive unit or file system driver not adapted for the AV mode writing, the apparatus can read the data to the end of the file without a hitch and without causing an abnormal end during the data reading operation.

In accordance with the foregoing embodiments, further, the apparatus can convert the PC file to the AV file after processing. Thus, the need of developing a new drive unit or file system driver adapted for the AV file writing can be eliminated, and the compulsive need of the PC user to purchase the new drive unit or file system driver and to install it can be minimized.

In addition, an application program for video editing or the like can be created with use of only an existing general (i.e., PC-mode-capable) API (Application Programming Interface), the present invention cannot be limited to only a combination with a AV-mode-capable file system driver to be newly developed, can realize the operation of the combination of an existing file system driver and application program, thus expanding the market of the application program.

What is claimed is:

1. A file management method having a first processing mode wherein upon occurrence of a write error for a file data to be written on a recording medium, replacement processing to write the data in another write area is carried out, and having a second processing mode wherein upon occurrence of a write error for a file data to be written on the recording medium, the replacement processing to write the data in another write area is not carried out, said recording medium storing file type information, said method includes the steps of:

reading a file type information associated with a file to be processed from the recording medium, the file type information being used for identifying a processing mode between said first processing mode and said second processing mode as file management information associated with said file;

converting said file type information indicative of said first processing mode to a file type information indicative of said second processing mode;

writing the converted file type information in the recording medium as the file management information associated with said file to be processed; and wherein said replacement processing is carried out on an ECC block basis, said block including N recording units termed as sectors, wherein N is a positive integer, and further comprising steps of:

judging whether or not in all the N sectors of said ECC blocks that store data belonging to the file, are occupied; and when judging that the data is not stored in the all N sectors of the ECC blocks, registering in said file management information remaining sector in which the data of the file to be processed is not stored as a stuffing.

2. A file management method as set forth in claim 1, further comprising the steps of:

judging whether or not data, termed as other data, belonging to a file, termed as another file, other than said file to be processed is stored in said remaining sector;

when judging that the other data is stored in the remaining sector, moving said other data to another ECC block; and reflecting a result of said movement in file management information.

3. A file management method as set forth in claim 2, wherein said step of reflecting the result of said movement includes;

deleting first data allocation information indicative of a data storage location on the recording medium prior to said movement in said file management information; and registering second data allocation information indicative of a data storage location on the recording medium after said movement in said file management information.

4. A file management method as set forth in claim 1, further comprising the steps of:

judging whether or not data belonging to a file other than said file to be processed is stored in said remaining sector;

when judging that the data is stored in said remaining sector, moving the data belonging to said file to be processed to an ECC block different from said ECC block; and reflecting a result of said movement in the file management information.

5. A file management method as set forth in claim 1, further comprising a step of setting a flag for inhibiting relocation of the file to be process in said management information.

6. A file management method according to claim 1 comprising the steps of:

reading data stored at another write area by said replacement processing; and writing said data in an original recording area where the data would have been written without said replacement processing wherein said replacement processing and the reading step and writing step are carried out on a basis of an ECC block including N recording units termed as sectors, wherein N is a positive integer.

7. A file management method having a first processing mode wherein upon occurrence of a write error for a file data to be written on a recording medium, replacement processing to write the data in another write area is carried out, and having a second processing mode wherein upon occurrence of a write error for a file data to be written on the recording medium, the replacement processing to write the data in another write area is not carried out, said recording medium storing file type information, said method includes the steps of:

judging without using said file type information whether or not said file to be processed is read in said second processing mode, the file type information being used for identifying a processing mode between said first processing mode and said second processing mode in said recording medium as file management information associated with said file;

when judging by said judgment step that said file to be processed is read, reading the data in said second processing mode;

when judging by said judgment step that said file to be processed is read, reading the data in said second processing mode;

when judging by said judgment step that said file to be processed is not read, reading the data in said first processing mode; and wherein said replacement processing is carried out on an ECC block basis, said block including N recording units termed as sectors, wherein N is a positive integer, and further comprising steps of:

judging whether or not in all the N sectors of said ECC blocks that store data belonging to the file, are occupied; and when judging that the data is not stored in the all N sectors of the ECC blocks, registering in said file management information remaining sector in which the data of the file to be processed is not stored as a stuffing.

8. A file management apparatus having a first processing mode wherein upon occurrence of a write error for a file data to be written on a recording medium, replacement processing to write the data in another write area is carried out, and having a second processing mode wherein upon occurrence of a write error for a file data to be written on the recording medium, the replacement processing to write the data in another write area is not carried out, said recording medium storing file type information, said apparatus comprising:

means for reading a file type information associated with a file to be processed from the recording medium, the file type information being used for identifying a processing mode between said first processing mode and said second processing mode as file management information associated with said file;

means for converting said file type from the file type indicative of said first processing mode to a file type indicative of said second processing mode;

means for writing the file type after conversion in the recording medium as file management information associated with said file to be processed; and wherein said replacement processing is carried out on an ECC block basis, said block as a recording unit including N sectors, wherein N is a positive integer, and further comprising:

means for judging whether or not in all the N sectors of said ECC blocks that store data belonging to the file, are occupied; and when said judging means judges that the data is not stored in the all N sectors of the ECC blocks, means for registering one of the remaining sectors in the ECC block in which the data of the file to be processed is not stored as stuffing in said file management information.

9. A file management apparatus as set forth in claim 8, further comprising:

means for judging whether or not data (referred to as other data) belonging to a file other than said file to be processed is stored in said remaining sector;

when said judging means judges that the other data is stored in the remaining sector, means for moving said other data to another ECC block; and means for reflecting a result of said movement in file management information.

10. A file management apparatus as set forth in claim 9, wherein said means for reflecting the result of said movement includes:

means for deleting first data allocation information indicative of a data storage location on the recording medium prior to said movement in said file management information; and means for registering second data allocation information indicative of a data storage location on the recording medium after said movement in said file management information.

11. A file management apparatus as set forth in claim 8, further comprising:

means for judging whether or not data belonging to a file other than said file to be processed is stored in said remaining sector;

when said judging means judges that the data is stored in said remaining sector, means for moving the data belonging to said file to be processed to an ECC block different from said ECC block; and means for reflecting a result of said movement in the file management information.

12. A file management apparatus as set forth in claim 8, further comprising means for setting a flag for inhibiting relocation of the file to be processed in said management information.

13. A file management apparatus according to claim 8 comprising:

means for reading data stored at another write area by said replacement processing; and means for writing said data in an original recording area where the data would have been written without said replacement processing, wherein said replacement processing and the reading and the writing are carried out on a basis of an ECC block including N recording units termed as sectors, wherein N is a positive integer.

14. A file management apparatus having a first processing mode wherein upon occurrence of a write error for a file data to be written on a recording medium, replacement processing to write the data in another write area is carried out, and having a second processing mode wherein upon occurrence of a write error for a file data to be written on the recording medium, the replacement processing to write the data in another write area is not carried out, said recording medium storing file type information, said apparatus comprising:

means for judging without using said file type information whether or not said file to be processed is read in said second processing mode, the file type information being used for identifying a processing mode between said first processing mode and said second processing mode in said recording medium as file management information associated with said file;

when said judging means judges that said file to be processed is read, means for reading the data in said second processing mode;

when said judging means judges that said file to be processed is not read, means for reading the data in said first processing mode; and wherein said replacement processing is carried out on an ECC block basis, said block as a recording unit including N sectors, wherein N is a positive integer, and further comprising:

means for judging whether or not in all the N sectors of said ECC blocks that store data belonging to the file, are occupied; and when said judging means judges that the data is not stored in the all N sectors of the ECC blocks, means for registering one of the remaining sectors in the ECC block in which the data of the file to be processed is not stored as stuffing in said file management information.

15. A program having a first processing mode wherein upon occurrence of a write error for a file data to be written on a recording medium, replacement processing to write the data in another write area is carried out, and having a second processing mode wherein upon occurrence of a write error for a file data to be written on the recording medium, replacement processing to write the data in another write area is not carried out, said recording medium storing file type information, said program for causing a computer to execute the steps:

reading a file type information associated with a file to be processed from the recording medium, the file type information being used for identifying a processing mode between said first processing mode and said second processing mode as file management information associated with said file;

converting said file type information indicative of said first processing mode to a file type information indicative of said second processing mode;

writing the converted file type information in the recording medium as the file management information associated with said file to be processed; and wherein said replacement processing is carried out on an ECC block basis, said block as a recording unit including N, wherein N is a positive integer sectors, said program for causing a computer to execute the steps of:

judging whether or not all the N sectors of said ECC blocks that store data belonging to the file, are occupied; and when said judging step judges that the data is not stored in the all N sectors of the ECC blocks, registering one of the remaining sectors in which the data of the file to be processed is not stored as a stuffing in said file management information.

16. A program as set forth in claim 15, further for causing a computer to execute the steps of:

judging whether or not data (referred to as other data) belonging to a file other than said file to be processed is stored in said remaining sector;

when said judging step judges that the other data is stored in the remaining sector, moving said other data to another ECC block; and reflecting a result of said movement in file management information.

17. A program as set forth in claim 16 for causing a computer to execute said step of reflecting the result of said movement further including:

deleting said first data allocation information indicative of a data storage on the recording medium prior to said movement in said file management information; and registering second data allocation information indicative of a data storage location on the recording medium after said movement in said file management information.

18. A program as set forth in claim 15 for causing a computer to execute further steps of:

judging whether or not data belonging to a file other than said file to be processed is sorted in said remaining sector;

when said judging step judges that the data is stored in said remaining sector, moving the data belonging to said file to be processed to an ECC block different from said ECC block; and reflecting a result of said movement in the file management information.

19. A program as set forth in claim 15, for causing a computer to execute further a step of setting a flag for inhibiting relocation of the file to be processed in said management information.

20. A program according to claim 15 said program for causing a computer to execute the steps of:

reading data stored at another write area by said replacement processing; and writing said data in an original recording area where the data would have been written without said replacement processing wherein said replacement processing and the reading step and the writing step are carried out on a basis of an ECC block including N recording units termed as sectors, wherein N is a positive integer.

21. A program having a first processing mode wherein, when data in the form of a file is written on a recording medium and a write error occurs, replacement processing to write the data in another write area is carried out, and having a second processing mode wherein, when the write error occurs, the replacement processing to write the data in the other write area is not carried out, for storing a file type, said program for causing a computer to execute the steps of:

judging without using said file type whether or not said file to be processed is read in said second processing mode, the file type being used for identifying a processing mode between said first processing mode and said second processing mode in said recording medium as file management information associated with said file;

when said judging step judges that said file to be processed is read, reading the data in said second processing mode;

when said judging step judges that said file to be processed is not read, reading the data in said first processing mode; and wherein said replacement processing is carried out on an ECC block basis, said block as a recording unit including N, wherein N is a positive integer sectors, said program for causing a computer to execute the steps of:

judging whether or not all the N sectors of said ECC blocks that store data belonging to the file, are occupied; and when said judging step judges that the data is not stored in the all N sectors of the ECC blocks, registering one of the remaining sectors in which the data of the file to be processed is not stored as a stuffing in said file management information.

22. A file management method having a first processing mode wherein upon occurrence of a write error for a file data to be written on a recording medium, replacement processing to write the data in another write area is carried out, and having a second processing mode wherein upon occurrence of a write error for a file data to be written on the recording medium, the replacement processing to write the data in another write area is not carried out, said recording medium storing file type information, said method comprising the steps of:

regarding the file type information of a file to be processed as said second processing mode regardless of said file type information and reading the data in said second processing mode, the file type information being used for identifying a processing mode between said first processing mode and said second progressing mode in said recording medium as file management information associated with said file; and wherein said replacement processing is carried out on an ECC block basis, said block including N recording units termed as sectors, wherein N is a positive integer, and further comprising steps of:

judging whether or not in all the N sectors of said ECC blocks that store data belonging to the file, are occupied; and when judging that the data is not stored in the all N sectors of the ECC blocks, registering in said file management information remaining sector in which the data of the file to be processed is not stored as a stuffing.

23. A file management apparatus having a first processing mode wherein upon occurrence of a write error for a file to be written on a recording medium, replacement processing to write the data in another write area is carried out, and having a second processing mode wherein upon occurrence of a write error for a file data to be written on the recording medium, the replacement processing to write the data in another write area is not carried out, said recording medium storing file type information, said apparatus comprising:

means for regarding the file type information of a file to be processed as said second processing mode regardless of said file type information and reading the data in said second processing mode, the file type information being used for identifying a processing mode between said first processing mode and said second processing mode in said recording medium as file management information associated with said file; and wherein said replacement processing is carried out on an ECC block basis, said block as a recording unit including N sectors, wherein N is a positive integer, and further comprising:

means for judging whether or not in all the N sectors of said ECC blocks that store data belonging to the file, are occupied; and when said judging means judges that the data is not stored in the all N sectors of the ECC blocks, means for registering one of the remaining sectors in the ECC block in which the data of the file to be processed is not stored as stuffing in said file management information.

24. A program having a first processing mode wherein upon occurrence of a write error for a file data to be written on a recording medium, replacement processing to write the data in another write area is carried out, and having a second processing mode wherein upon occurrence of a write error for a file data to be written on the recording medium, the replacement processing to write the data in another write area is not carried out, said recording medium storing file type information said program for causing a computer to execute the step of:

regarding the file type information of a file to be processed as said second processing mode regardless of said file type information and reading the data in said second processing mode, the file type information being used for identifying a processing mode between said first processing mode and said second processing mode in said recording medium as file management information associated with said file; and wherein said replacement processing is carried out on an ECC block basis, said block as a recording unit including N, wherein N is a positive integer sectors, said program for causing a computer to execute the steps of:

judging whether or not all the N sectors of said ECC blocks that store data belonging to the file, are occupied; and when said judging step judges that the data is not stored in the all N sectors of the ECC blocks, registering one of the remaining sectors in which the data of the file to be processed is not stored as a stuffing in said file management information.

25. A file management method for managing data stored in a recording medium in a file form, the method comprising the steps of:

recording information on a file type of the data in the recording medium, the file type in the data being both of a first file type associated with a first processing mode in which a data reading operation stops in response to an error in the data and a second file type associated with a second processing mode in which a data reading operation is kept continued regardless of an error in the data;

reading the information on the file type of the data to be processed from the recording medium, the file type information being used for identifying a processing mode between said first processing mode and said second processing mode;

converting the first file type of the data read from the recording medium to the second file type in response to existence of a part of the first file type;

writing the converted second file type into the recording medium;

reading out the data, a file type of which is the second file type, from the recording medium; and replacing a part of the data in the first file type in the recording medium on an ECC blocks basis in case that the reading operation stops, the block including N-recording units termed as sectors, wherein N is a positive integer;

judging whether or not all the N sectors of the ECC blocks are occupied; and registering, in the information on the file type recorded in the recording medium, a remaining sector as a stuffing when the all the N sectors of the ECC blocks are occupied.

* * * * *